United States Patent [19]

Keum et al.

[11] Patent Number: 5,432,116

[45] Date of Patent: Jul. 11, 1995

[54] METHOD FOR THE FABRICATION OF DYNAMIC RANDOM ACCESS MEMORY CAPACITOR

[76] Inventors: Dong Y. Keum; Cheol S. Park, both of C/O, Hyundai Electronics Industries Co., Ltd., San 136-1, Ami-ri, Bubal-eub, Ichon-kun, Kyoungki-do, Rep. of Korea

[21] Appl. No.: 294,840

[22] Filed: Aug. 29, 1994

[30] Foreign Application Priority Data

Aug. 30, 1993 [KR] Rep. of Korea .................. 93-17001

[51] Int. Cl.⁶ .......................................... H01L 21/8242
[52] U.S. Cl. ...................................... 437/60; 437/195; 437/919
[58] Field of Search .................. 437/60, 195, 919; 148/DIG. 14

[56] References Cited

U.S. PATENT DOCUMENTS

| | | | |
|---|---|---|---|
| 5,126,280 | 6/1992 | Chan et al. | 437/60 |
| 5,137,842 | 8/1992 | Chan et al. | 437/60 |
| 5,168,073 | 12/1992 | Gonzalez et al. | 437/919 |

*Primary Examiner*—Chandra Chaudhari
*Attorney, Agent, or Firm*—Gary M. Nath; John F. McGowan; Nath, Amberly & Associates

[57] ABSTRACT

A method for fabricating a dynamic random access memory capacitor. It is characterized by forming multi-insulating films with different etch selection ratio between conduction layers over a planarizing film, making the upper and lower portion of conduction pattern undercut by use of the difference in etch selection ratio when defining the capacitor into a pin structure, forming the insulating spacer in such a way to fill the undercut portions, forming the conduction spacer at the side wall of the insulating spacer, and etching the conduction layer at the inside of the insulating spacer, in a predetermined thickness, to form the inside conduction spacer. Accordingly, the capacitor fabricated by the method is structured to have a plurality of pin-shaped conduction layers with each being coated with a conduction spacer. Since the method takes advantage of the difference in etch selection ratio, it employs few etch masks, which facilitates the fabrication of DRAM capacitor. In addition, the increase of surface area by the conduction spacers results in the increase of capacitance in the capacitor. Furthermore, the capacitor has fewer steps than the conventional ones with the same capacitance, so that the method has significant advantage over conventional methods, including the capability of coating the steps.

7 Claims, 4 Drawing Sheets

METHOD FOR THE FABRICATION OF DYNAMIC RANDOM ACCESS MEMORY CAPACITOR

BACKGROUND OF THE INVENTION

1. Field of the Invention

The present invention relates, in general, to a method for the fabrication of dynamic random access memory (hereinafter referred to as "DRAM") capacitor and, more particularly, to an improvement in both capacitance and topology of the capacitor along with the method.

2. Description of the Prior Art

Recent high integration trend of DRAM inevitably involves a reduction in cell dimension. However, such a reduction in cell dimension results in a difficulty to form capacitors having a sufficient capacitance. This is because the capacitance is in proportion to the surface area of capacitor. In a case of a DRAM device constituted by one MOS transistor and one capacitor, in particular, it is important to reduce the cell dimension and yet obtain a high capacitance of the capacitor, for the high integration of the DRAM device.

Capacitance of such a capacitor formed on a reduced area can be expressed by the following equation:

Capacitance (C) ∝ Dielectric Constant × Surface Area ÷ Thickness of *Dielectric Layer Many research and development efforts have been made to increase the capacitance. For example, there have been known use of a dielectric material exhibiting a high dielectric constant, formation of a thin dielectric layer, formation of a capacitor having an increased surface area. However, each of these techniques has its problem. In other words, although various materials have been proposed as the dielectric material exhibiting a high dielectric constant, they have not been confirmed in reliance and thin film characteristic such as junction breakdown voltage. The reduction in thickness of dielectric layer results in damage of the dielectric layer, severely affecting the reliance of capacitor. For increasing the surface area of capacitor, a complex process should be used. Furthermore, the increase in surface area results in a degradation in integration degree.

Generally, existing capacitors include a conduction layer comprised of a polysilicon layer and a dielectric layer comprised of an oxide film, a nitride film or a combination thereof. For an increase in surface area of capacitor, the polysilicon layer has a multi-layer structure and spacers having a pin shape, a cylindrical shape or a rectangular frame shape extending through the multi-layer structure to connect layers of the multi-layer structure.

Now, a description will be made in conjunction with the pin-shaped capacitor. For fabricating the pin-shaped capacitor, first, an interlayer insulating film and a first planarizing layer superior in fluidity are sequentially formed over a semiconductor substrate having a field oxide film at its element isolation region and MOS field effect transistor (hereinafter referred to as "MOSFET") type elements such as a gate oxide film and a gate at its active region, thereby planarizing the semiconductor substrate. Thereafter, a first conduction layer, a first insulating film, a second conduction layer and a second insulating film are sequentially formed over the first planarizing layer.

Subsequently, all the layers formed over the semiconductor substrate are sequentially removed at their portions disposed over a portion of the semiconductor substrate defined as the active region to be in contact with a capacitor, thereby forming a contact hole. A third conduction layer is coated over the resulting structure so as to fill the contact hole. Over the third conduction layer, a third insulating film is formed. Thus, a pin-shaped capacitor is obtained which has a structure of vertically connecting the conduction layers with one another.

Although this multi-layer structure described allows the conventional pin-shaped capacitor to have an increased surface area, it still has an insufficient capacitance due to the high integration of a DRAM device employing it. As a result, the DRAM device encounters a degradation in reliance of its operation. Since the capacitor had the multi-layer structure, an increase in topology occurs, thereby causing subsequent layers to be degraded in capability of coating steps.

On the other hand, in fabrication of the cylindrical capacitor, a conduction layer is coated over a planarizing layer of a semiconductor substrate structure obtained after formation of a contact hole through which an active region of the semiconductor substrate to be in contact with a capacitor, so as to fill the contact hole. An insulating film pattern having a cylindrical bar shape is then formed on a portion of the conduction layer.

Although the cylindrical capacitor has an advantage of a reduced topology, as compared with the pin-shaped capacitor, it encounters a degradation in integration degree because it should occupy a large area for obtaining a sufficient capacitance, due to its small surface area. Of course, the capacitance may be increased by repeatedly forming cylindrical side walls to be shaped into a plurality of concentric circles. In this case, however, the overall fabrication becomes complex.

SUMMARY OF THE INVENTION

Therefore, an object of the invention is to solve the above-mentioned problems encountered in the prior art and, thus, to provide a method for fabricating a DRAM capacitor having a combination of the pin-shaped structure and the cylindrical structure, capable of increasing its capacitance and yet reducing its topology.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

Figure 1A:
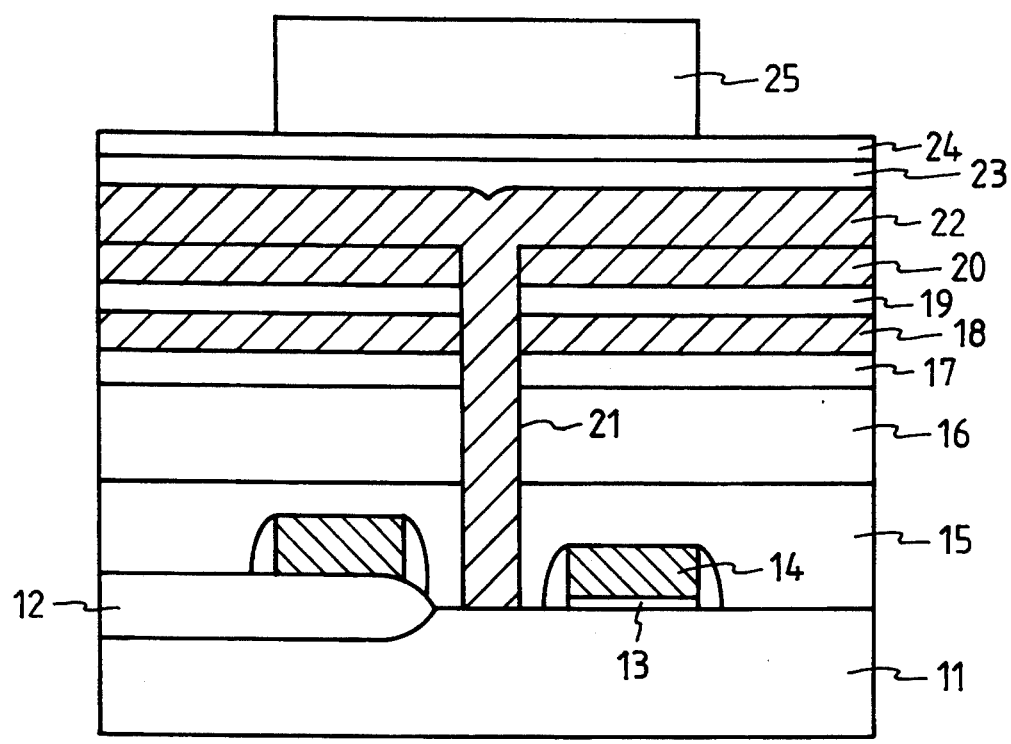
FIGS. 1A through 1H are cross-sectional views stepwise illustrating a method for fabricating a DRAM capacitor, according to the present invention.

The application of the preferred embodiment of the present invention is best understood with reference to FIGS. 1A through 1H, wherein like reference numerals are used for like and corresponding parts of the drawings, respectively.

First, referring to FIG. 1A, there is shown a representative MOSFET structure, a semiconductor substrate 11 having a field oxide film 12 at its element isolation region and a gate oxide film 13 and a gate 14 at its active region, over which an interlayer insulating film 15, a bit line (not shown) and a planarizing layer 16 are sequentially formed.

Also, this drawing shows that a first insulating film 17, a conduction layer 18, a second insulating film 19 and a second conduction layer 20 are sequentially formed over the first planarizing layer 16. The second conduction layer 20, a film necessary to form a contact hole by a subsequent etch step, is to reduce the size of the contact hole. If the contact hole has a large size sufficient to form a photosensitive film pattern or if the photosensitive film pattern to open the contact hole is formed in very small size, for example, in a size of not less than 0.4 µm, the second conduction layer 20 may not be formed.

Subsequently, the layers formed over the semiconductor substrate, the second conduction layer 20 through the interlayer insulating film 15, are sequentially removed at their portions disposed over a portion of the semiconductor substrate defined as the active region to be in contact with a capacitor, thereby forming a contact hole 21. A third conduction layer 22 is coated over the resulting structure, so as to fill the contact hole 21. Over the third conduction layer, a third insulating film 23 and a forth insulating film 24 are sequentially formed. Thereafter, a photosensitive film pattern 25 is formed over a portion of the fourth insulating film 24 which portion is to be defined as a capacitor and covers the contact hole 21.

With regard to the insulating films formed, they are preferably made of different materials in consideration of subsequent etch processes. In accordance with the present invention, a material for the second insulating film 19 and the third insulating film 23 is superior to that for the first insulating film 17 and the fourth insulating film 24 in selection ratio when wet etch or HF vapor etch is applied. For example, the second insulating film 19 and the third insulating film 23 are made of phosphosilicate glass (hereinafter referred to as "PSG") while the first insulating film 17 and the fourth insulating film 23 are made of high or medium temperature oxide or of tetraethylozthosilicate (hereinafter referred to as "TEOS"). For the first, second, and third conduction layers 18, 20, 22, they are made of polysilicon or amorphous silicon.

Figure 1B:
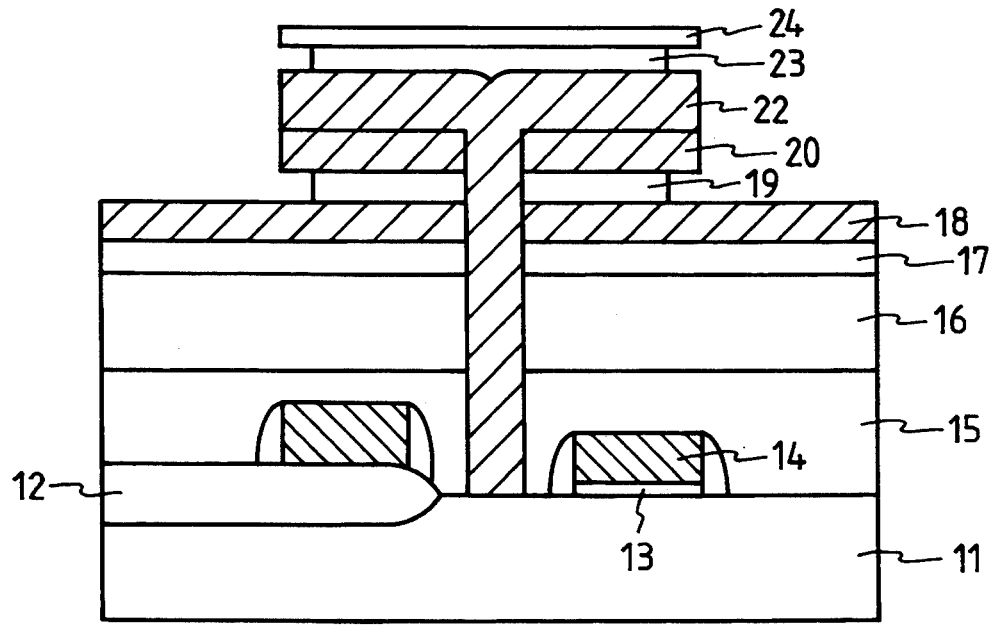

Using the photosensitive film pattern 25 as a mask, the fourth insulating film 24, the third insulating film 23, the third conduction layer 22, the second conduction layer 20 and the second insulating film 19 are sequentially removed at areas uncovered by the photosensitive film pattern 25, so as to expose the first conduction layer 18 partially, as shown in FIG. 1B. After the partial removal of the forth, third and second insulating films 24, 23, 19, the photosensitive film pattern 25 is removed.

As a result of the partial removal, a forth insulating film 24 pattern, a third insulating film 23 pattern undercut, a third conduction layer 22 pattern, a second conduction layer 20 pattern and a second insulating film 19 pattern undercut are obtained since the second and third insulating film 19, 23 are made of a material having a high selection ratio.

Figure 1C:
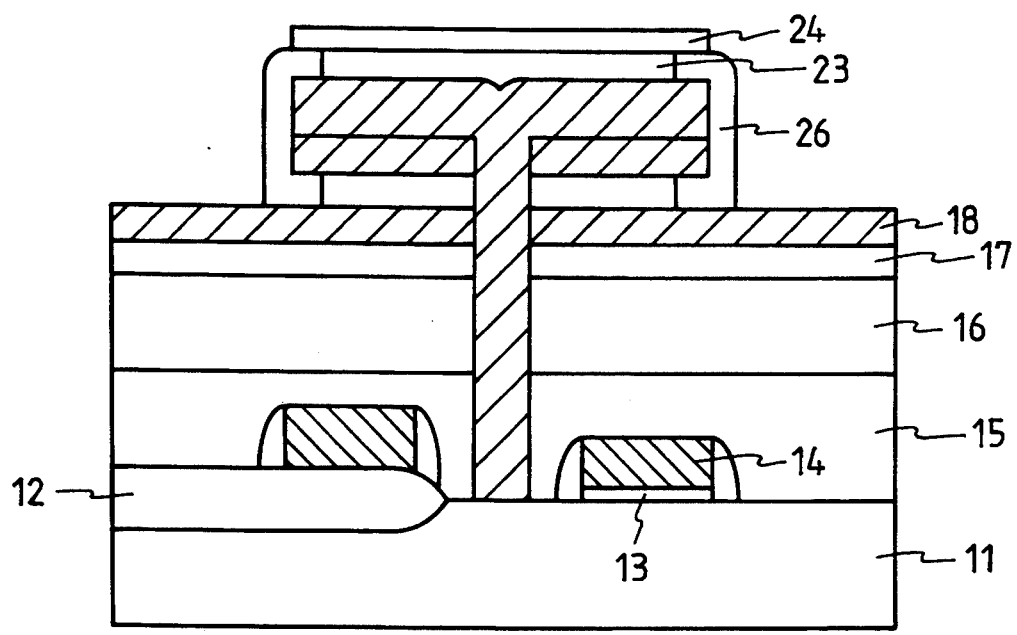

Referring now to FIG. 1C, there is shown a [—shaped insulating spacer 26 which is formed at a side wall provided by all the second insulating film 19 pattern undercut, the second conduction layer 20 pattern, the third conduction layer 22 pattern and the third insulating film 23 pattern undercut. The [—shaped insulating spacer 26 is formed by forming a predetermined material having a low etch selection ratio, for example, a high or medium temperature oxide film or a TEOS insulating film if the second and third insulating films made of PSG, on the entire surface of the structure of FIG. 1B and then, by etching the predetermined material anisotropically.

Figure 1D:
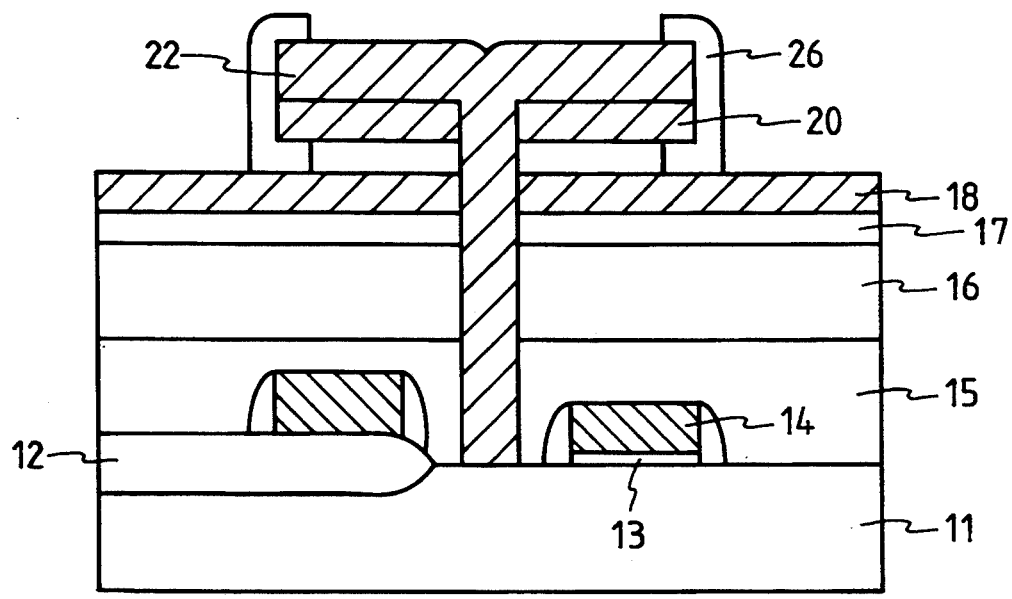

Thereafter, the fourth insulating film 24 pattern and the third insulating film 23 pattern are etched off, to expose the third conduction layer 22 pattern, as shown in FIG. 1D.

Figure 1E:
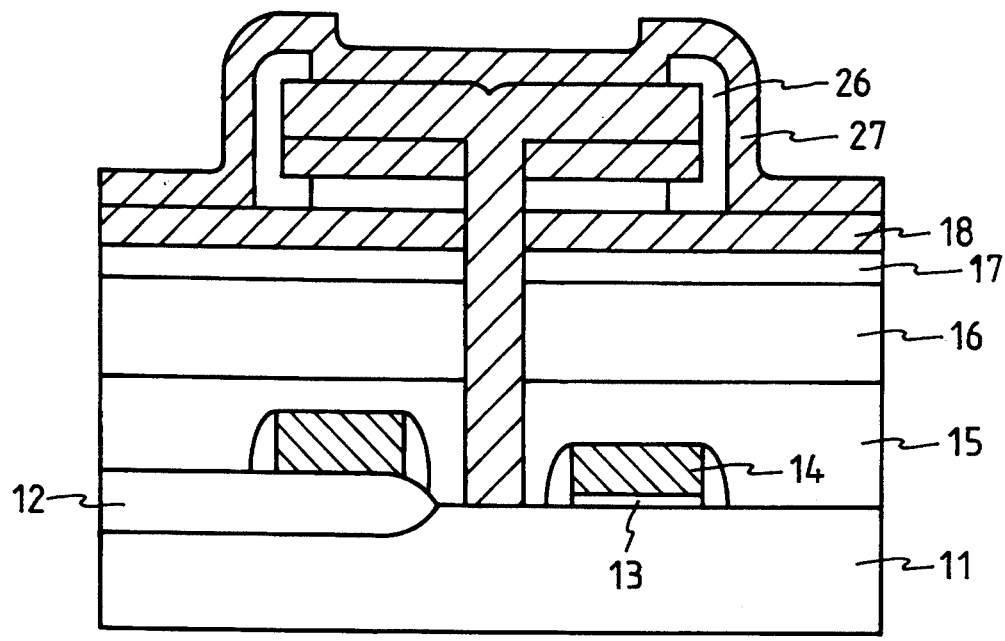

In FIG. 1E, there is shown a fourth conduction layer 27 that is formed on the entire surface of the resulting structure of FIG. 1D.

Figure 1F:
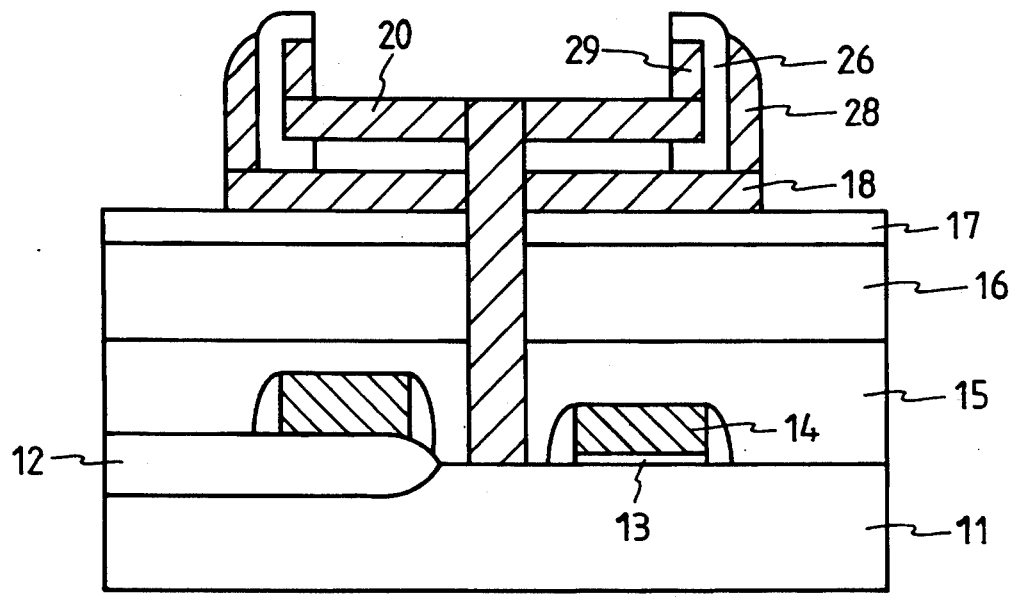

Next, the fourth conduction layer 27 is subjected to an anisotropic etch so as to form a first conduction spacer 28 at a side wall of the insulating spacer 26, as shown in FIG. 1F. This anisotropic etch further removes the areas of the first and third conduction layers 18, 22 which are exposed by the removal of the fourth conduction layer 27, thus isolating the capacitor as well as forming a second conduction spacer 29, a part of the third conduction layer 22 protected by the [—shaped insulating spacer 26.

Figure 1G:
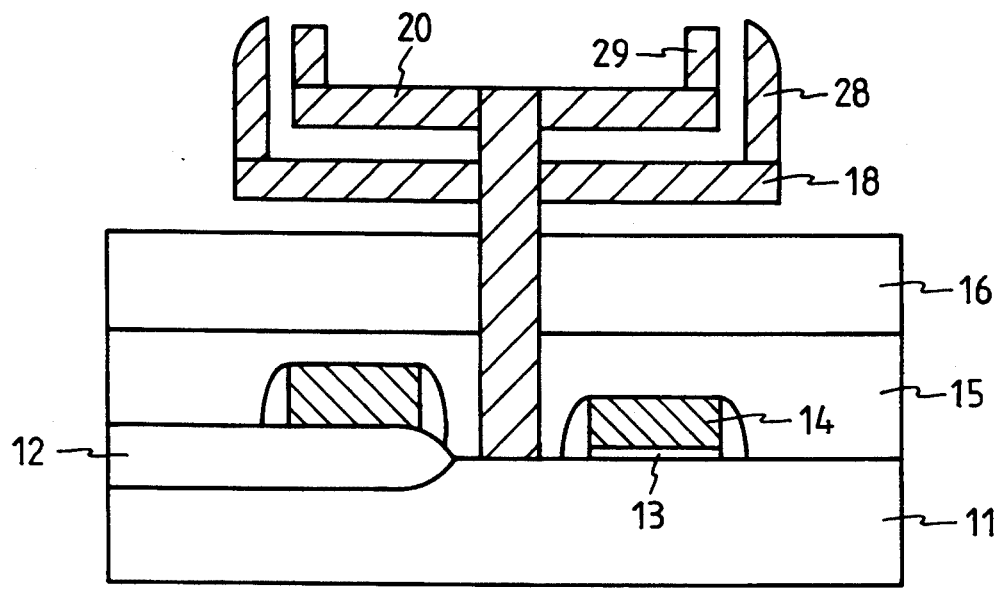

Another etch process is undertaken to remove the insulating spacer 26, the second insulating film 19 pattern and the first insulating film 17 completely, exposing the entire surfaces of the conduction layers, as shown in FIG. 1G.

Figure 1H:
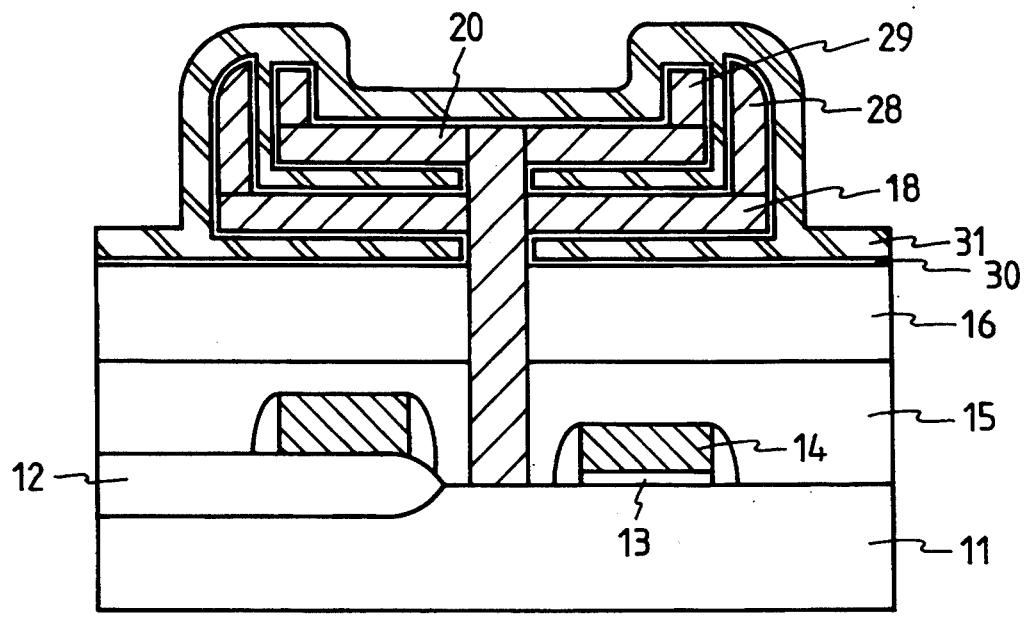

Referring to FIG. 1H, there are shown a fifth insulating film 30 and a plate electrode 31 that are sequentially formed on all exposed surfaces of the exposed conduction layers and on the surface of the planarizing layer. The fifth insulating film 30 is made of oxide, nitride, or oxide-nitride-oxide and used to serve as a dielectrics.

Although there has been described a capacitor which is structured to have two, pin-shaped conduction layers with each being coated with a conduction spacer, a capacitor in which the two, pin-shaped conduction layers are repeated can be fabricated in accordance with the method of the present invention. In addition, a capacitor in which three or more, pin-shaped conduction layers with each being coated with a conduction spacer may be obtained by laminating the third and fourth insulating film 23, 24 repetitively, intercalating another conduction layer connected with the third conduction layer 22 therebetween and executing the subsequent formation processes for insulating spacer and conduction spacer.

As described hereinbefore, the fabrication method for DRAM capacitor according to the present invention is characterized by forming multi-insulating films with different etch selection ratio between conduction layers over the planarizing film, making the upper and lower portion of the conduction pattern undercut by use of the difference in etch selection ratio when defining the capacitor into a pin structure, forming the insulating spacer in such a way to fill the undercut portions, forming the conduction spacer at the side wall of the insulating spacer, and etching the conduction layer at the inside of the insulating spacer, in a predetermined thickness, to form the inside conduction spacer. Accordingly, the capacitor fabricated by the method is structured to have a plurality of pin-shaped conduction layers with each being coated with a conduction spacer.

Since the present method takes advantage of the difference in etch selection ratio, it employs few etch masks, which facilitates the fabrication of DRAM capacitor. In addition, the increase of surface area by the conduction spacers results in the increase of capacitance in the capacitor. Furthermore, the capacitor fabricated by the method of the present invention has fewer steps than the conventional ones with the same capacitance, so that the method has significant advantage over conventional methods, including the capability of coating the steps.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for fabricating a DRAM capacitor, comprising the steps of:
    (a) forming a planarizing layer, a first insulating film, a first conduction layer and a second insulating film sequentially over a semiconductor substrate having a field oxide film, a gate oxide film and a gate;
    (b) removing the layers formed over said semiconductor substrate, at their portions disposed over a portion of the semiconductor substrate to be in contact with a capacitor, so as to form a contact hole;
    (c) forming a second conduction layer, a third insulating film and a fourth insulating film sequentially over the second insulating film, said second conduction layer filling the contact hole and said fourth insulating film being superior to said third insulating film in etch selection ratio;
    (d) removing from the fourth insulating film sequentially by use of a photoetch process in such a way to leave a portion to be the capacitor over the contact hole, so as to form a fourth insulating pattern, a third insulating film pattern undercut, a second conduction layer pattern and a second insulating film pattern undercut;
    (e) forming an insulating spacer at a side wall provided by the third insulating film pattern, the second conduction layer pattern, and the second insulating film pattern in such a way to fill the undercut portions and removing the fourth insulating film pattern and the third insulating film pattern;
    (f) forming a first conduction spacer at a side wall of the insulating spacer;
    (g) removing the first conduction layer at the outside of the first conduction spacer and the second conduction layer at the inside of the insulating spacer, in a thickness to isolate the capacitor and to form a second conduction spacer at the inside of the first conduction spacer; and
    (h) removing the insulating spacer and the second conduction layer pattern and forming a fifth insulating film and a plate electrode sequentially over the entire exposed surface.

2. A method for fabricating a DRAM capacitor set forth as claim 1, wherein, in the (a), (c) and (f) steps, said first conduction layer, said second conduction layer and said first conduction spacer are formed with polysilicon or amorphous silicon.

3. A method for fabricating a DRAM capacitor set forth as claim 1, wherein an etch buffer conduction layer is additionally formed prior to the (b) step of forming the contact hole, so as to reduce the size of the contact hole.

4. A method for fabricating a DRAM capacitor set forth as claim 1, wherein, in the (a) and (c) steps, said second and third insulating films are formed with phosphosilicate glass and said first and fourth insulating films are formed with a high temperature oxide or with tetraethylorthosilicate.

5. A method for fabricating a DRAM capacitor set forth as claim 1, wherein said insulating spacer and said first conduction spacer are formed by anisotropically etching the insulating films and the polysilicon layers.

6. A method for fabricating a DRAM capacitor set forth as claim 1, wherein said second conduction layer is formed more thickly than said first conduction layer in the (c) step, allowing said second spacer to be formed by etching anisotropically without an additional etch mask in the (g) step.

7. A method for fabricating a DRAM capacitor set forth as claim 1, wherein said third and fourth insulating films and the formation of said insulating spacer and said first and second conduction spacers are repeated in the (b) through (f) steps, to form a plurality of conduction spacers.

* * * * *